(12) United States Patent
Cho

(10) Patent No.: US 6,355,521 B1
(45) Date of Patent: Mar. 12, 2002

(54) METHOD OF MANUFACTURING A CAPACITOR IN A SEMICONDUCTOR DEVICE

(75) Inventor: Ho Jin Cho, Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/659,509

(22) Filed: Sep. 11, 2000

(30) Foreign Application Priority Data

Sep. 10, 1999 (KR) ............................................. 99-38660

(51) Int. Cl.$^7$ ............................................. H01L 21/336
(52) U.S. Cl. ........................ 438/254; 438/240; 257/308; 257/309
(58) Field of Search ................................ 438/240, 238, 438/250, 253–256, 396, 397, 669, 702; 257/308, 309, 310

(56) References Cited

U.S. PATENT DOCUMENTS

| | | | |
|---|---|---|---|
| 5,219,778 A | 6/1993 | Dennison et al. | |
| 5,298,436 A | 3/1994 | Radosevich et al. | |
| 5,405,796 A | 4/1995 | Jones | |
| 5,728,618 A | * 3/1998 | Tseng | 438/253 |
| 6,153,490 A | * 11/2000 | Xing et al. | 438/396 |

* cited by examiner

Primary Examiner—David Nelms
Assistant Examiner—Dung Anh Le
(74) Attorney, Agent, or Firm—Pennie & Edmonds LLP

(57) ABSTRACT

The present invention discloses a method of manufacturing a capacitor in a semiconductor device which is directed to solve the problem of reduction of capacitance occurring when manufacturing a capacitor of a MIS structure using poly-silicon as an underlying electrode and metal as an upper electrode in a capacitor using $Ta_2O_5$ as a dielectric film. In order to solve the problem, the present invention forms an underlying electrode using metal having a good oxide-resistant such as TiSiN. Thus, the present invention could not only lower the thickness of the effective oxide film of $Ta_2O_5$ when depositing $Ta_2O_5$ or performing a thermal process for crystallization but also prevent increase of a leak current due to oxidization of the underlying electrode and the diffusion prevention film, thus securing the capacitance of the capacitor and improving the electric characteristic of the capacitor.

14 Claims, 2 Drawing Sheets

METHOD OF MANUFACTURING A CAPACITOR IN A SEMICONDUCTOR DEVICE

BACKGROUND OF THE INVENTION

1. Field of the Invention

The invention relates generally to a method of manufacturing a capacitor in a semiconductor device, and more particularly to, a method of manufacturing a capacitor in a semiconductor device in which metal having a good oxide-resistant is used to form an underlying electrode, thus lowering the effective thickness of the $Ta_2O_5$ to increase the capacitance of a capacitor in a capacitor using $Ta_2O_5$ as a dielectric film.

2. Description of the Prior Art

Generally, as semiconductor devices become higher integrated and miniaturized, there is a trend that the area occupied by capacitors also become small. Even though the area of the capacitor becomes smaller, the capacitance of the capacitor required to drive the device must be secured. In order to secure the capacitance, it is required that the underlying electrode be formed in a three dimensional structure for increasing the effective surface area. However, this method has a complicated process. Thus, it is impossible that it is applied to a higher integrated semiconductor device having more than 256M DRAM. Another method of securing the capacitance is a method of manufacturing a capacitor by using a dielectric having a high dielectric constant.

Recently, a research by which $Ta_2O_5$ having the characteristic of a high insulation-breakage voltage while having the dielectric constant of 20–25 is used as capacitor materials for Giga DRAM, has been actively progressed. Generally, the $Ta_2O_5$ capacitor uses poly-silicon as an underlying electrode and TiN as an upper electrode. However, the $Ta_2O_5$ capacitor is thick in about 30–35 Å in the thickness of the effective oxide film $T_{ox}$. As it also uses TiN as an upper electrode, if a high temperature process at more than 750° C. is performed after TiN is deposited, there is a problem that the thickness of the effective oxide film is further increased. In this type of $Ta_2O_5$ capacitor having a MIS structure, in order to compensate for reduction of capacitance due to increase of the thickness of the effective oxide film, the underlying electrode is usually made of a cylindrical structure to increase the effective surface area. However, in order to make a high cylindrical structure more than 1.0 μm, there is limits to increase the effective surface area due to difficulty in the process.

Further, when depositing $Ta_2O_5$ or performing a thermal treatment process for crystallization under a high oxygen atmosphere, an underlying electrode and a diffusion prevention film in the $Ta_2O_5$ capacitor are likely to be oxidized. Thus, there is a problem that the leak current is increased to degrade the electrical characteristic of the capacitor.

SUMMARY OF THE INVENTION

It is therefore an object of the present invention to provide a method of manufacturing a capacitor in a semiconductor device, which can not only lower the thickness of the effective oxide film of $Ta_2O_5$ but also prevent increase of the leak current due to oxidization of an underlying electrode and an diffusion prevention film in a capacitor using $Ta_2O_5$ as a dielectric film.

In order to accomplish the object, a method of manufacturing a capacitor in a semiconductor device is characterized in that it comprises the steps of providing a semiconductor substrate in which a contact plug having a recess is formed; forming a contact film and a diffusion prevention film within the recess of the contact plug; forming a sacrifice oxide film in which a hole pattern through the diffusion prevention film is exposed formed; forming an oxide-resistant conductive layer on the entire structure including the sacrifice oxide film in which the hole pattern is formed; remaining the oxide-resistant conductive layer in the hole pattern and removing the sacrifice oxide film, thereby forming an underlying electrode of a cylindrical structure; forming a $Ta_2O_5$ dielectric film on the underlying electrode; and forming an upper electrode on the dielectric film.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
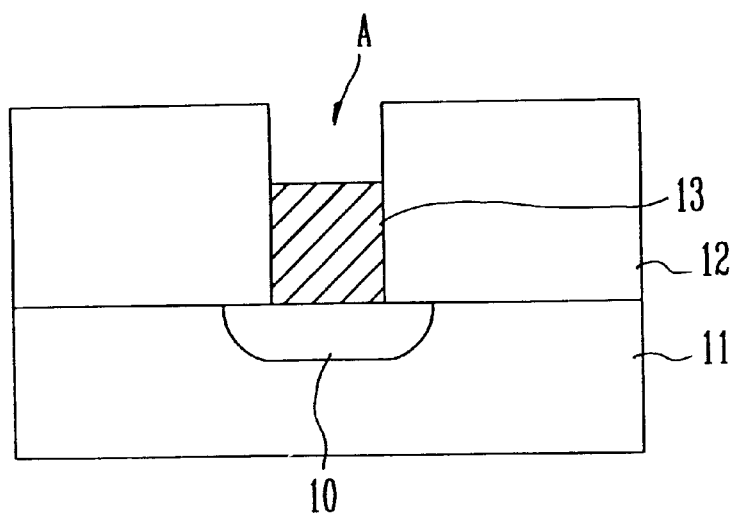
FIGS. 1A through 1E are sectional views for sequentially illustrating a method of manufacturing a capacitor in a semiconductor device according to the present invention.

The present invention will be described in detail by way of a preferred embodiment with reference to accompanying drawings, in which like reference numerals are used to identify the same or similar parts.

FIGS. 1A through 1E are sectional views for sequentially illustrating a method of manufacturing a capacitor in a semiconductor device according to the present invention.

Referring now to FIG. 1A, an interlayer insulating film 12 is formed on a semiconductor device 11 in which various components for forming a semiconductor device are formed. Then, a portion of the interlayer insulating film 12 is etched to form a contact hole by which a junction 10 is exposed. Next, a contact plug 13 having a contact recess A is formed within the contact hole.

In the above process, the contact plug 13 is deposited with poly-silicon by chemical vapor deposition method so that the contact hole of which can be completely buried. Then, if a blanket etching process or a chemical mechanical polishing process is overly performed, poly-silicon is further etched in 500 through 2000 Å from the entrance of the contact hole toward the inside thereof, thus forming a recess A.

Figure 1B:
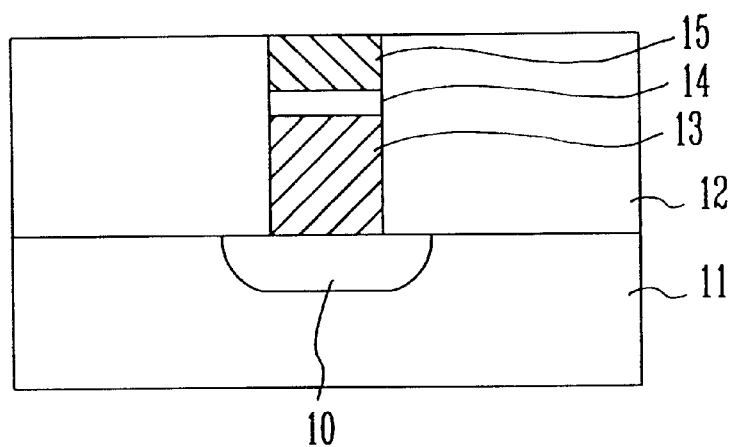

Referring now to FIG. 1B, a contact film 14 and a diffusion prevention film 15 are formed within the recess of the contact plug 13.

In the above process, the contact film 14 is deposited with Ti in the thickness of 100 through 1000 Å on the interlayer insulating film 12 including the contact plug 13 having the recess at the temperature of by a sputter method or a chemical vapor deposition method. Then, it experiences a Rapid Thermal Nitridation (RTN) for 30 through 120 seconds at the temperature of 550 through 950° C., thus forming a titanium silicide on the surface of the contact plug 13 while removing an un-reacted TiN. The contact film 14 may be formed with tantalum silicide by using Ta instead of Ti. After depositing with TiSiN in thickness of 500 through 5000 Å at the temperature of 200 through 700° C. by means of chemical vapor deposition method using any one of $SiCl_4$, $SiH_2Cl_2$ and $SiHCl_3$ in $TiCl_4+NH_3$ or depositing with TiSiN in thickness of 500 through 5000 Å at the temperature of 200 through 700° C. by means of metal organic chemical vapor deposition method using any one of $SiCl_4$, $SiH_2Cl_2$ and $SiHCl_3$ in a precursor such as TDMAT, TDEAT etc., the diffusion prevention film 15 is formed on the contact film 14 by blanket etching process or chemical mechanical polishing process. The diffusion prevention film 15 can be formed using TiAlN, TaSiN, TaAlN, TaN, TiN, TaN etc. instead of TiSiN.

Figure 1C:
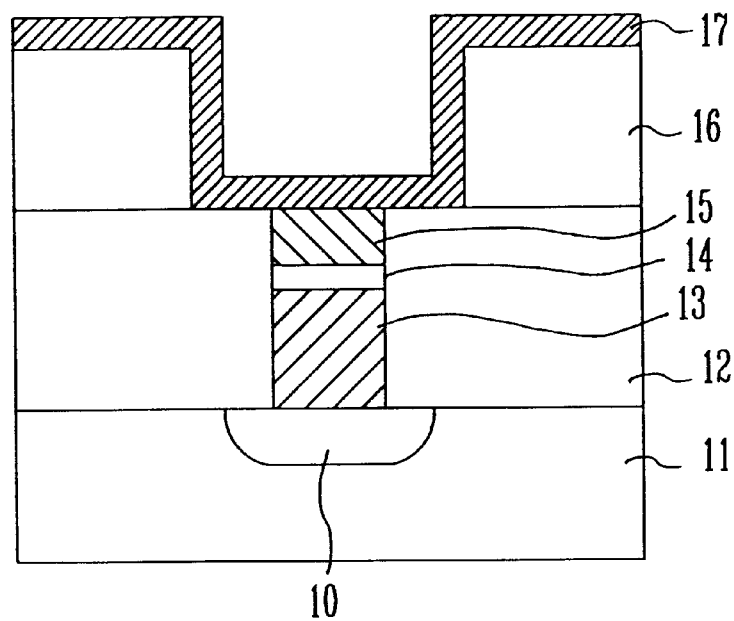

Referring now to FIG. 1C, a sacrifice oxide film 16 is deposited on the entire structure including the diffusion prevention film 15. Then, the sacrifice oxide film 16 on the portion of which the underlying electrode will be formed is etched to form a hole pattern through which the diffusion prevention film 15 is exposed. Next, an oxide-resistant conductive layer 17 is formed on the entire structure including the sacrifice oxide film 16 in which the hole pattern is formed and also the bottom and sidewalls of the hole pattern itself.

In the above process, the oxide-resistant conductive layer 17 can be formed by depositing with TiSiN in thickness of 500 through 500 Å at the temperature of 200 through 700° C. by means of chemical vapor deposition method using any one of $SiCl_4$, $SiH_2Cl_2$ and $SiHCl_3$ in $TiCl_4+NH_3$ or by depositing with TiSiN in thickness of 200 through 500 Å at the temperature of 200 through 700° C. by means of metal organic chemical vapor deposition method using any one of $SiCi_4$, $SiH_2Cl_2$ and $SiHCl_3$ in the precursor such as TDMAT or TDEAT etc. The oxide-resistant conductive layer 17 may be formed using Pt, Ir, Ru, $IrO_2$, $RuO_2$ etc. instead of TiSiN.

Figure 1D:
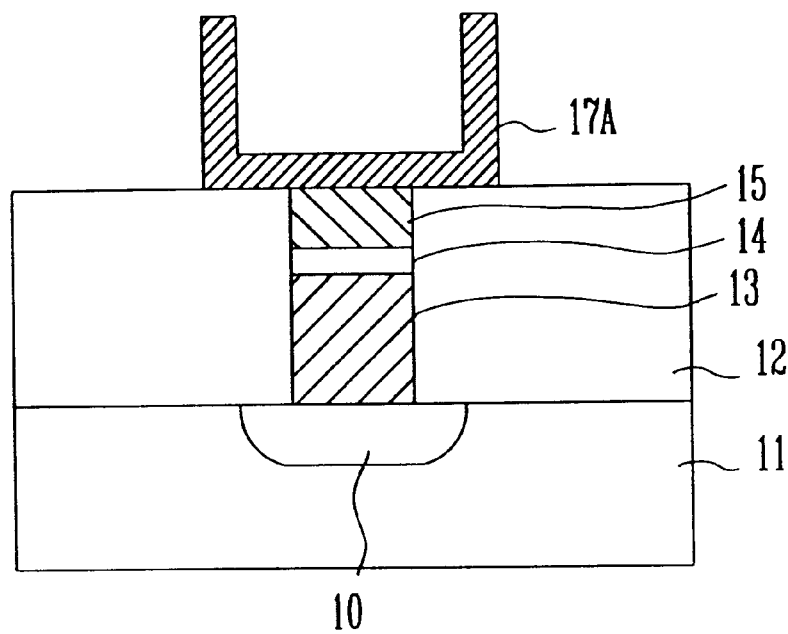

Referring now to FIG. 1D, the oxide-resistant conductive layer 17 on the sacrifice oxide film 16 is removed by blanket etching process or chemical mechanical polishing process to remain the oxide-resistant conductive layer 17 only within the hole pattern. Then, the sacrifice oxide film 16 is completely removed by wet etching method to form an underlying electrode 17A of a cylindrical structure.

Figure 1E:
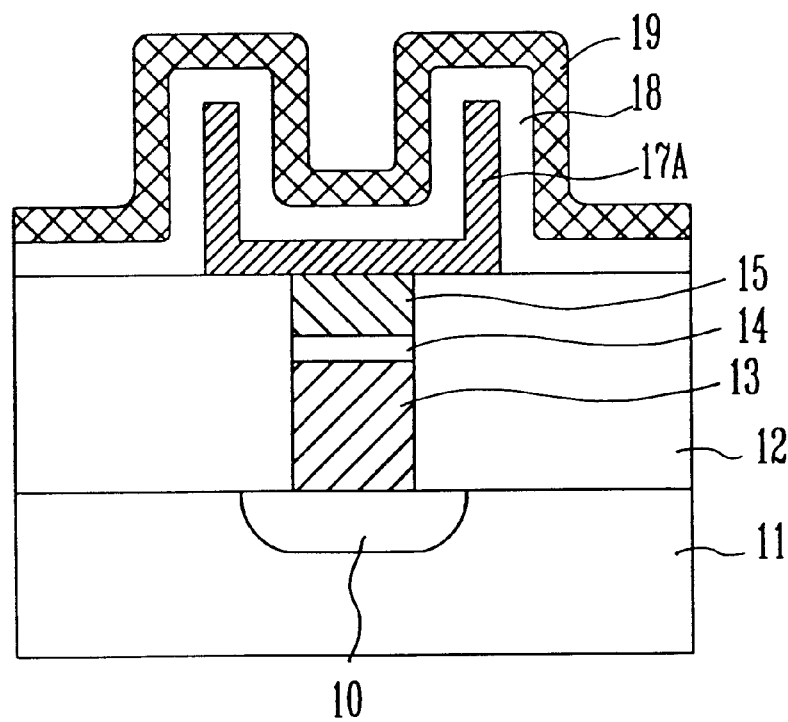

Finally, referring now to FIG. 1E, a $Ta_2O_5$ dielectric film 18 is formed to cover the underlying electrode 17A of a cylindrical structure and an upper electrode 19 is then formed on the $Ta_2O_5$ dielectric film 18, thus forming a capacitor.

In the above process, the $Ta_2O_5$ dielectric film 18 may be formed by performing a thermal process under nitrogen atmospheres for crystallization, performing a $N_2O$ plasma or an $UV-O_3$ process at the temperature of more than 400° C. in order to compensate for deficiency of oxygen within the film while removing impurities such as carbon or by performing a post thermal process under oxygen atmosphere, after it is deposited in thickness of 50 through 200 Å at the temperature of 300 through 500° C. by means of metal organic chemical vapor deposition method. The upper electrode 19 may be formed using any one of TiSiN, TiN and WN.

As can be understood from the above description with the present invention, the present invention can lower the thickness of the effective oxide film of $Ta_2O_5$ to about 10 through 15 Å by forming an underlying electrode using metal having a good oxide-resistant such as TiSiN, thus increasing the capacitance. Also it can prohibit oxidization of the underlying electrode when depositing $Ta_2O_5$ or performing a thermal process for crystallization, thus preventing a leak current and improving the electrical characteristic. Further, as the present invention uses metal having a good oxide-resistant as an electrode, it can obviate the process of forming a diffusion prevention film, thus obtaining a simplified process.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a capacitor in a semiconductor device, comprising the steps of:

providing a semiconductor substrate in which a contact plug having a recess is formed;

forming a contact film and a diffusion prevention film within the recess of the contact plug, said diffusion prevention film being formed by depositing TiSiN by means of a chemical vapor deposition method;

forming a sacrificial oxide film in which a hole pattern through the diffusion prevention film is formed;

forming an oxide-resistant conductive layer on the entire structure including the sacrificial oxide film in which the hole pattern is formed;

remaining the oxide resistant conductive layer in the hole pattern and removing the sacrificial oxide film, thereby forming an underlying electrode of a cylindrical structure;

forming a $Ta_2O_5$ dielectric film on the underlying electrode; and forming an upper electrode on the dielectric film.

2. The method of manufacturing a capacitor in a semiconductor device according to claim 1, wherein said contact film is formed of titanium silicide or tantalum silicide.

3. The method of manufacturing a capacitor in a semiconductor according to claim 1, wherein said diffusion prevention film is formed by blanket etching process or chemical mechanical polishing process, after it is deposited with TiSiN by adding any one of $SiCl_4$,$SiH_2Cl_2$ and $SiHCl_3$ in $TCl_4+NH_3$ or is deposited with TiSiN by adding any one of $SiCl_4$, $SiH_2Cl_2$ and $SiHCl_3$ in a precursor such as TDMAT or TDEAT.

4. The method of manufacturing a capacitor in a semiconductor device according to claim 1, wherein said oxide-resistant conductive layer is TiSiN that is deposited by adding any one of $SiCl_4$, $SiH_2Cl_2$ and $SiHCl_3$ in $TiC_4+NH_3$ or by adding any one of $SiCl_4$, $SiH_2Cl_2$ and $SiHCl_3$ in a precursor such as TDMAT or TDEAT.

5. The method of manufacturing a capacitor in a semiconductor device according to claim 1, wherein said underlying electrode is formed using any one of TiSiN, Pt, Ir, Ru, $IrO_2$ and $RuO_2$.

6. The method of manufacturing a capacitor in a semiconductor device according to claim 1, wherein said upper electrode is formed using any one of TiSiN, TiN and WN.

7. The method according to claim 1, wherein the step of forming the oxide-resistant conductive layer comprises adding any one of $SiCl_4$, $SiH_2Cl_2$ and $SiHCl_3$ in $TCl_4+NH_3$ to thereby form a TiSiN oxide-resistant conductive layer.

8. A method of manufacturing a capacitor in a semiconductor device, comprising the steps of:

providing a semiconductor substrate;

forming a contact hole in the semiconductor substrate;

forming a contact plug in the contact hole;

forming a contact film on top of the contact plug within the contact hole;

forming a TiSiN diffusion prevention film by means of a chemical vapor deposition process, on top of the contact film in the contact hole;

forming a sacrificial oxide film on the semiconductor substrate including on the TiSiN diffusion prevention film;

forming a cylindrical hole pattern in the sacrificial oxide film to thereby expose the TiSiN diffusion prevention film;

forming an oxide-resistant conductive layer on the sacrificial oxide film including sidewalls of the cylindrical hole pattern and on the exposed TiSiN diffusion prevention film;

removing the sacrificial oxide film along with the oxide-resistant conductive layer on top of the sacrificial oxide film, while leaving only the sacrificial oxide film on sidewalls of the cylindrical hole pattern and on the exposed TiSiN diffusion prevention film, to thereby form an underlying electrode having a cylindrical structure;

forming a $Ta_2O_5$ dielectric film on the underlying electrode; and forming an upper electrode on the $Ta_2O_5$ dielectric film.

9. The method according to claim 8, wherein the step of forming the oxide-resistant conductive layer comprises adding any one of $SiCl_4$, $SiH_2Cl_2$ and $SiHCl_3$ in $TCl_4+NH_3$ to thereby form a TiSiN oxide-resistant conductive layer.

10. The method according to claim 9, wherein the upper electrode is also formed of TiSiN.

11. A method of manufacturing a capacitor in a semiconductor device, comprising the steps of:

providing a semiconductor substrate;

forming a contact hole in the semiconductor substrate;

forming a contact plug in the contact hole;

forming a contact film on top of the contact plug within the contact hole;

forming a TiSiN diffusion prevention film on top of the contact film in the contact hole;

forming a sacrificial oxide film on the semiconductor substrate including on the TiSiN diffusion prevention film;

forming a cylindrical hole pattern in the sacrificial oxide film to thereby expose the TiSiN diffusion prevention film;

forming an oxide-resistant conductive layer on the sacrificial oxide film including sidewalls of the cylindrical hole pattern and on the exposed TiSiN diffusion prevention film;

removing the sacrificial oxide film along with the oxide-resistant conductive layer on top of the sacrificial oxide film, while leaving only the sacrificial oxide film on sidewalls of the cylindrical hole pattern and on the exposed TiSiN diffusion prevention film, to thereby form an underlying electrode having a cylindrical structure;

forming a $Ta_2O_5$ dielectric film on the underlying electrode; and forming an upper electrode on the $Ta_2O_5$ dielectric film.

12. The method according to claim 11, wherein the a TiSiN diffusion prevention film is formed by a chemical vapor deposition process.

13. The method according to claim 12, wherein the step of forming the oxide-resistant conductive layer comprises adding any one of $SiCl_4$, $SiH_2Cl_2$ and $SiHCl_3$ in $TCl_4+NH_3$ to thereby form a TiSiN oxide-resistant conductive layer.

14. The method according to claim 13, wherein the upper electrode is also formed of TiSiN.

* * * * *